(12) United States Patent
Hargrove et al.

(10) Patent No.: US 6,426,244 B2
(45) Date of Patent: Jul. 30, 2002

(54) PROCESS OF FORMING A THICK OXIDE FIELD EFFECT TRANSISTOR

(75) Inventors: Michael J. Hargrove, Clinton Corners, NY (US); Mario M. Pelella, Gainesville, FL (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/903,820

(22) Filed: Jul. 12, 2001

Related U.S. Application Data

(62) Division of application No. 09/227,695, filed on Jan. 8, 1999, now Pat. No. 6,323,522.

(51) Int. Cl.[7] ............................................. H01L 21/00
(52) U.S. Cl. ................... 438/149; 438/155; 438/164; 438/197; 438/200; 438/151; 257/347; 257/352; 257/353; 257/355
(58) Field of Search ................................ 438/149, 155, 438/164, 197, 200, 151; 257/347, 352, 353, 355; 357/23.7

(56) References Cited

U.S. PATENT DOCUMENTS

| | | | |
|---|---|---|---|
| 4,989,057 A | * | 1/1991 | Lu .............................. 357/23.7 |
| 5,436,183 A | * | 7/1995 | Davis et al. ................. 438/200 |
| 5,597,747 A | | 1/1997 | Chen |
| 5,683,918 A | | 11/1997 | Smith et al. |
| 5,708,288 A | | 1/1998 | Quigley et al. |
| 5,726,844 A | | 3/1998 | Smith |
| 5,760,444 A | | 6/1998 | Okumura |
| 5,773,326 A | | 6/1998 | Gilbert et al. |
| 5,811,857 A | * | 9/1998 | Assaderagjo et al. ....... 257/335 |
| 5,854,561 A | | 12/1998 | Arimoto et al. |
| 5,982,003 A | * | 11/1999 | Hu et al. .................... 257/347 |
| 6,096,584 A | * | 8/2000 | Ellis-Monaghan et al. .. 438/151 |

* cited by examiner

*Primary Examiner*—Caridad Everhart
*Assistant Examiner*—Belur V Keshavan
(74) *Attorney, Agent, or Firm*—Ratner & Prestia; Joseph P. Abate, Esq.

(57) ABSTRACT

A SOI field effect transistor structure providing ESD protection. The structure has a source, a drain, a body, and a gate. The gate is formed from a thick oxide layer and a metal contact. The gate s formed during the BEOL process. The transistor may by a p-type transistor or an n-type transistor. The transistor may have its drain tied to either the gate, the body, or both the gate and body. When used as a protection device, the drain is tied to a signal pad and the source is tied to a potential reference.

10 Claims, 9 Drawing Sheets

PROCESS OF FORMING A THICK OXIDE FIELD EFFECT TRANSISTOR

This application is a divisional of U.S. patent application Ser. No. 09/227,695, filed on Jan. 8, 1999, which has been allowed and is now U.S. Pat. No. 6,323,522.

FIELD OF THE INVENTION

The present invention relates, in general, to a silicon-on-insulator (SOI) type semiconductor device and, more specifically, to a body-and-gate-coupled thick oxide structure providing electrostatic discharge (ESD) protection in a network.

BACKGROUND OF THE INVENTION

Protection networks are typically used in integrated circuits to protect internal components from ESD. In bulk semiconductor material, components may be fabricated to dissipate excess charge during an ESD event. Common types of components used for ESD protection include metal oxide semiconductor field effect transistors (MOSFETs) and thick field oxide (TFO) punch-through devices. In each of these components, the breakdown voltage of the component is determined by the breakdown voltage of a p-n junction within the component. The area of the p-n junction is usually large enough to be able to dissipate the excess charge during an ESD event.

With increased demand for higher speed operation for a semiconductor device, integrated circuits formed on a SOI substrate are attracting attention. The components used for ESD protection for bulk semiconductor devices cannot readily be used by themselves in SOI devices. Much of the area of the p-n junction is lost, because of the buried oxide layer immediately underneath the diffused regions. Consequently, a much smaller area is available to dissipate the excess charge from the ESD event. Because the energy does not dissipate as effectively, the device may overheat and permanent damage may occur.

Various SOI structures have been fabricated which are capable of providing ESD protection. One such structure is disclosed in U.S. Pat. No. 5,760,444 issued to Okumura on Jun. 2, 1998. Okumura describes a separate ESD diode device that is integrated with a MOSFET during the fabrication process. The diode is in electrical connection with the MOSEET through the drain region. When an excess potential is applied to the drain region of the MOSFET, the diode is forward biased to provide a path for electric charges running in the diode. As a result, the SOI semiconductor device has a resistance to electrostatic breakdown. The disadvantage of this device is that it requires extra process step during fabrication; it also lacks flexibility in how the device may be connected to other devices while still providing ESD protection.

Another structure is disclosed in U.S. Pat. No. 5,773,326 issued to Gilbert et al. on Jun. 30, 1998. Gilbert et al. describes a SOI structure which is partitioned into an ESD protection portion and a circuitry portion. The ESD protection portion requires a thick SOI layer to work. The thick SOI layer serves to distribute the ESD current and heat over a large area, thereby improving the ability of the SOI structure to withstand an ESD event.

Yet another structure is disclosed in U.S. Pat. No. 5,726,844 issued to Smith on Mar. 10, 1998. Smith describes a protection circuit, for an SOI device, which uses a body-tied MOSFET and zener diodes in the protection circuit. Because the MOSFET has a thin-gate oxide, several zener diodes are required to protect for over-voltage and under-voltage conditions.

Still another structure is disclosed in U.S. Pat. No. 5,683,918 issued to Smith et al. on Nov. 4, 1997. Smith et al. describe a body-tied MOSFET used in a protection network of a SOI device. The ESD protection device has a vulnerable thin gate oxide and requires a large silicon layout area to be effective.

Another approach for protecting SOI circuitry from ESD is found in U.S. Pat. No. 5,811,857. The '857 patent issued to Assaderaghi et al. on Sep. 22, 1998 and is incorporated herein by reference. Assaderaghi et al. disclose a SOI circuit which includes a body-coupled-gated (BCG) diode formed from a SOI MOSFET for providing ESD protection. Both NMOSFETs and PMOSFETs may be used to create a forward-biased operation of the diode. Referring to FIGS. 1a–1d (which correspond to FIGS. 2, 3, 5 and 6 of Assaderaghi et al.), two configurations of the BCG diodes are disclosed. FIG. 1a illustrates the circuit schematic of an NMOSFET 100. As shown, NMOSFET 100 comprises a source 108, drain 106, body 104, and gate 102. The drain, body, and gate are connected at node A. When node A is greater in voltage than node B, NMOSFET 100 turns on, thus providing ESD protection. Effectively, NMOSFET 100 may be represented by the diode symbol, as shown in FIG. 1b.

Similarly, as shown in FIGS. 1c and 1d, a PMOSFET 110 comprises a source 108, drain 106, body 104, and gate 102. The drain, body, and gate are connected at node A. When node B is greater in voltage than node A, PMOSFET 110 turns on, thus providing ESD protection. Effectively, PMOSFET 110 may be represented by the diode symbol, as shown in FIG. 1d.

It will be appreciated, however, that the NMOSFET and the PMOSFET disclosed by Assaderaghi et al. are both formed with thin-gate oxides and, therefore, are both vulnerable to high voltage ESD events. Moreover, the MOSFETs require that the body contact the gate and the drain. This requirement limits the flexibility of the MOSFETs.

A need still exists for forming a protection network for a SOI device that will allow the device to be protected from ESD potentials that may reach an input/output pad of an integrated circuit. It would be advantageous to have a semiconductor structure which provides adequate ESD protection, but requires a small area for heat dissipation. It would also be advantageous if the structure could be fabricated in a process which could easily be integrated with existing semiconductor processes.

SUMMARY OF THE INVENTION

To meet this and other needs, and in view of its purposes, the present invention is directed to a SOI field effect transistor structure providing ESD protection. The structure has a source, a drain, a body, and a gate. The gate is formed from a thick oxide layer and a metal contact. The gate is formed during the back-end-of-the-line (BEOL) process. The transistor may be a p-type transistor or an n-type transistor. The transistor may have its drain tied to either the gate, the body, or both the gate and body. When used as a protection device, the drain is tied to a signal pad and the source is tied to a potential reference.

The process for forming the thick oxide field effect transistor includes the following steps. First, a SOI structure having a semiconductor island is formed by shallow trench isolation; the semiconductor island is of a first conductivity type. Next, a separate source region and a separate drain region in the island are formed using a dopant having a second conductivity type; the remaining region of the first conductivity type forms the body region. An insulating layer is deposited above the island. The insulating layer is etched to form a thick oxide gate region above the body region. Finally, metal leads are formed to contact the source, drain, body, and gate regions.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 1A:
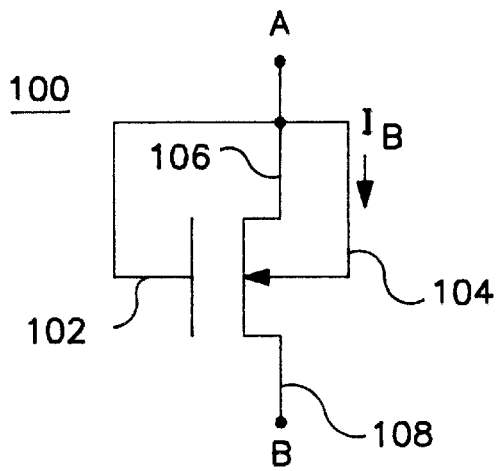
FIGS. 1a and 1b are circuit schematics of an n-channel FET (NFET) configured as a body-coupled and gate-coupled diode in accordance with FIGS. 2 and 3 of the '857 patent.
Figure 1B:
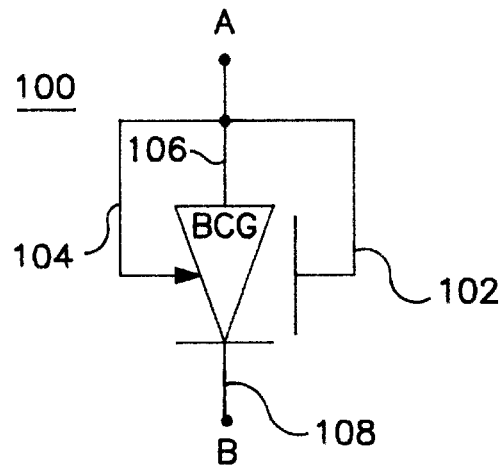
Figure 1C:
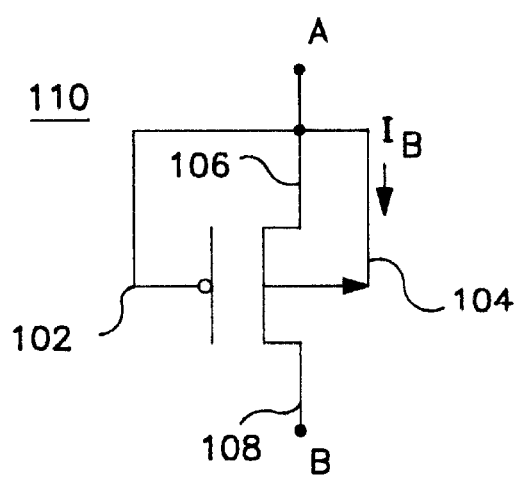
FIGS. 1c and 1d are circuit schematics of a p-channel FET (PFET) configured as a body-coupled and gate-coupled diode in accordance with FIGS. 5 and 6 of the '857 patent.
Figure 1D:
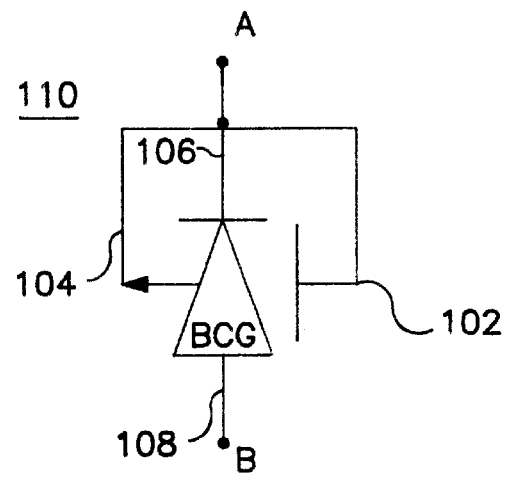
Figure 2A:
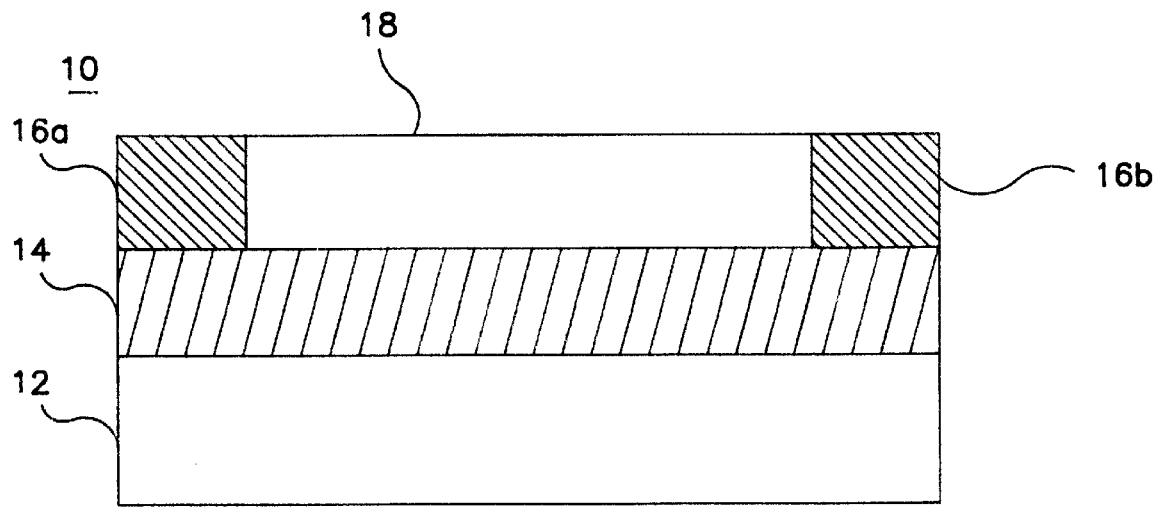
FIGS. 2a–2d are cross-sectional views of the structure of a SOI NMOSFET at various stages of fabrication in accordance with a preferred embodiment of the present invention.

Referring to FIGS. 2a–2d, a NMOSFET device 10 is shown at various stages of fabrication in accordance with a preferred embodiment of the present invention. As depicted in FIG. 2a, NMOSFET device 10 includes a semiconductor substrate layer 12, an insulating layer 14, and a semiconductor layer 18. Semiconductor substrate layer 12 is a lightly doped p-type silicon wafer. In this embodiment, insulating layer 14 is a silicon dioxide layer. The combination of semiconductor substrate layer 12, insulating layer 14, and semiconductor layer 18 is known as the SOI structure. The SOI structure may be formed by any conventional technique for fabricating SOI structures. For example, the SOI structure may be formed by implanting a high concentration of oxygen in semiconductor substrate layer 12 by a conventional separation-by-implanted-oxygen (SIMOX) technique.

Alternatively, the SOI structure may be formed by a conventional bond and etch back process.

Field isolation regions 16a and 16b are formed as illustrated in FIG. 2a. Although shallow trench isolation (STI) regions are illustrated, other field isolation processes may be used. By forming STI regions in a conventional manner, semiconductor layer 18 is separated into several islands (one is shown in FIG. 2a). A thin oxide layer (not shown), for example silicon dioxide, may be grown over the island of semiconductor layer 18. The thin oxide layer may be formed by using photoresist and masking techniques known by those skilled in the art.

Figure 2B:
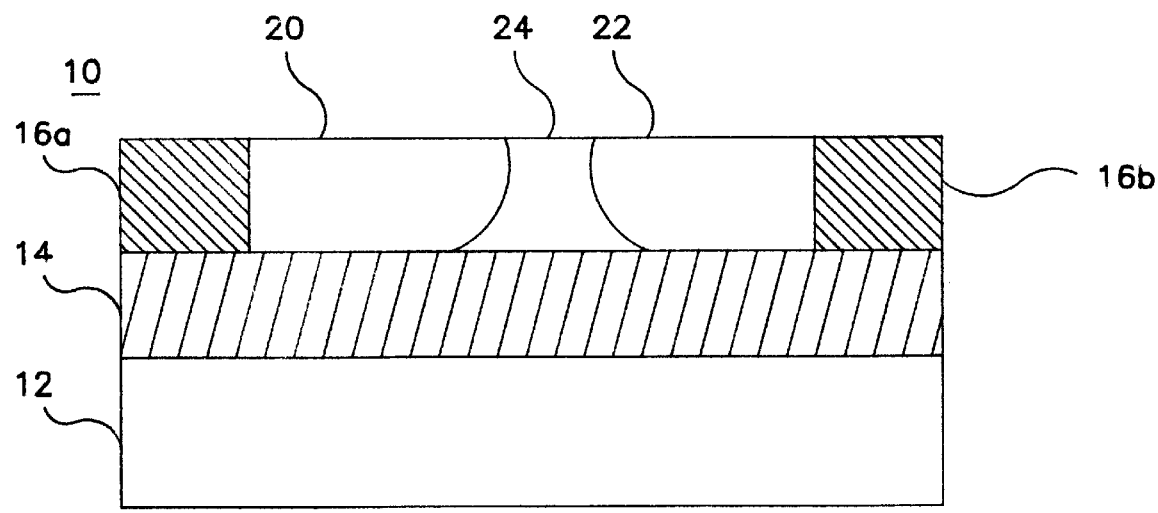

Next, a buried resistor (BR) mask (not shown) is placed over semiconductor layer 18 to subsequently form source region 20 and drain region 22, shown in FIG. 2b, by Ion implantation through uncovered regions in the mask. Ion-implanting of arsenic (As) is performed at 70 KeV with a dose of about $5 \times 10^{15}$ atoms/cm$^2$. As a result, heavily doped n+ type regions 20 and 22 are formed. The formation of n+ regions 20 and 22 is not self-aligning. The body region 24 remains a lightly doped p-type region because the BR mask prevents ion implantation in body region 24. Body region 24 thus forms the body between source region 20 and drain it region 22 of NMOSFET 10.

Figure 2C:
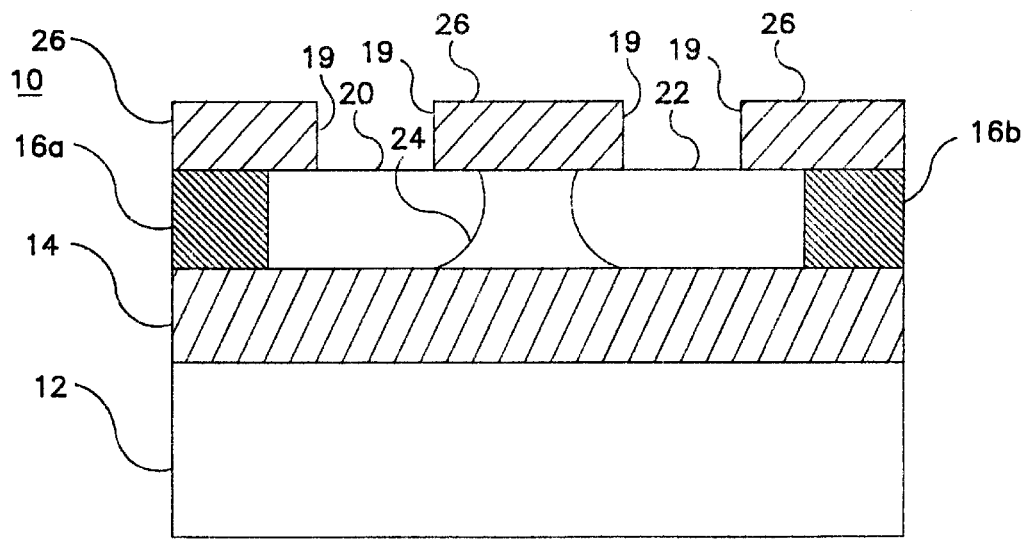

The next step of fabrication is shown in FIG. 2c. An insulating layer 26, for example silicon dioxide, is deposited over field isolation regions 16a and 16b, source region 20, drain region 22, and body region 24. Insulating layer 26 may be formed as an inter-level dielectric during the back-end-of-the-line (BEOL) fabrication process. Insulating layer 26 may range in thickness between about 2,000 to 3,000 Å and may have a preferred thickness of approximately 2,500 Å.

Figure 2D:
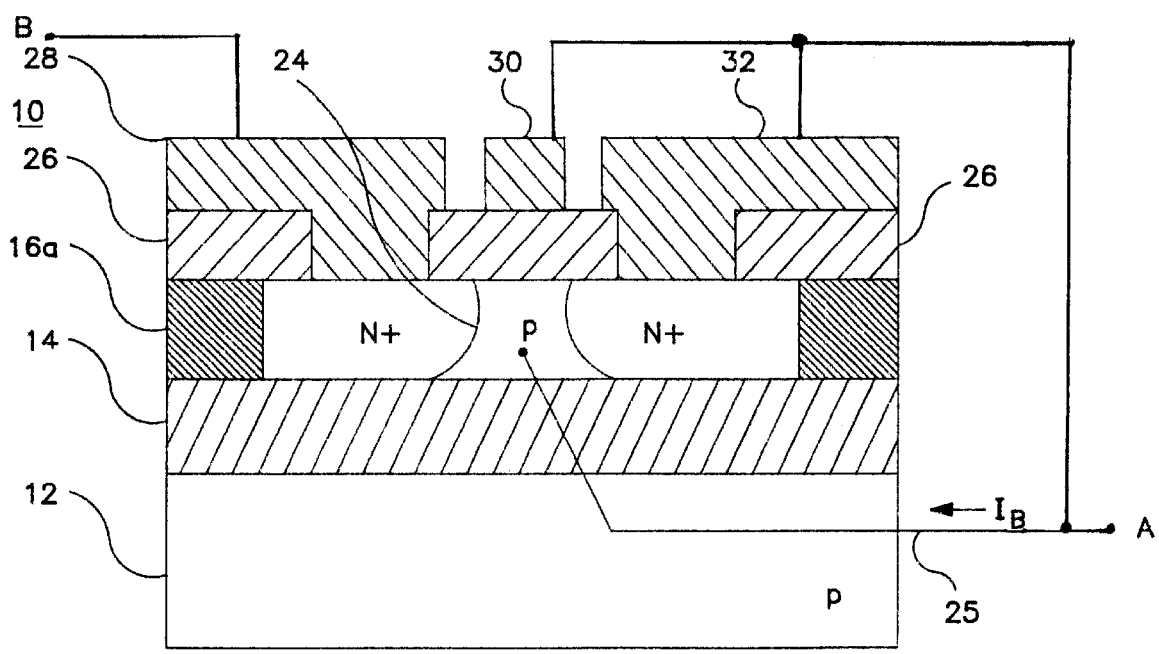

After insulating layer 26 is deposited, contact holes or vias 19 are formed by etching down to source region 20 and drain region 22, as shown in FIG. 2c. Finally metal leads are deposited to form source lead 28, drain lead 32, and gate lead 30, as shown in FIG. 2d. The formation of vias 19 and the metal leads is accomplished in a conventional manner during the BEOL fabrication process. Although not shown as a process step, body lead 25 is formed as a conventional T-type structure with a metal contact to body region 24.

Figure 2E:
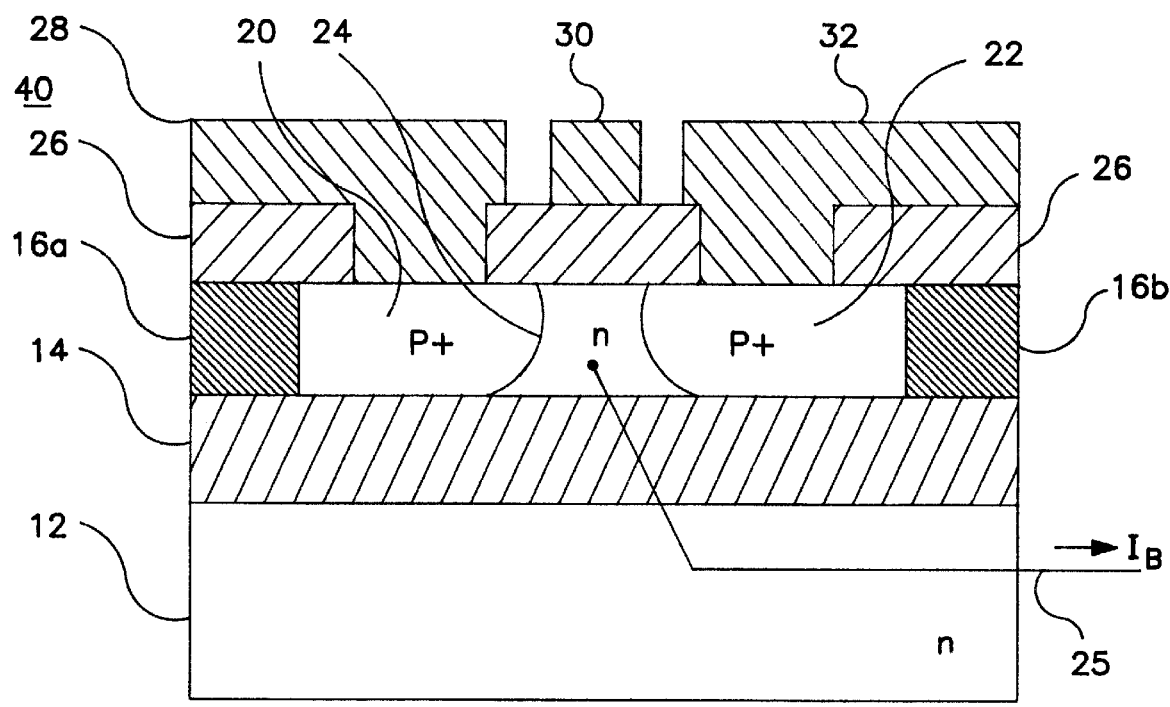
FIG. 2e is a cross-sectional view of the structure of a SOI PMOSFET in accordance with a preferred embodiment of the present invention.

Similarly, as shown in FIG. 2e, a thick-oxide PMOSFET 40 is formed from a SOI structure having a semiconductor substrate layer 12; an insulating layer 14; field isolation regions 16a and 16b; heavily doped p+ type source region 20 and drain region 22; lightly doped n-type body region 24; and a thick oxide layer above body region 24 to form insulating layer 26. Finally, metal leads are deposited to for source lead 28, drain lead 32, gate lead 30, and body lead 25.

As an example, FIG. 2D illustrates the gate, body and drain connected to a first terminal A. The source is connected to terminal B. Terminals A and B may be pads and may be connected to voltage reference terminals, as shown, for example, in FIGS. 5 and 7–9.

Figure 2F:
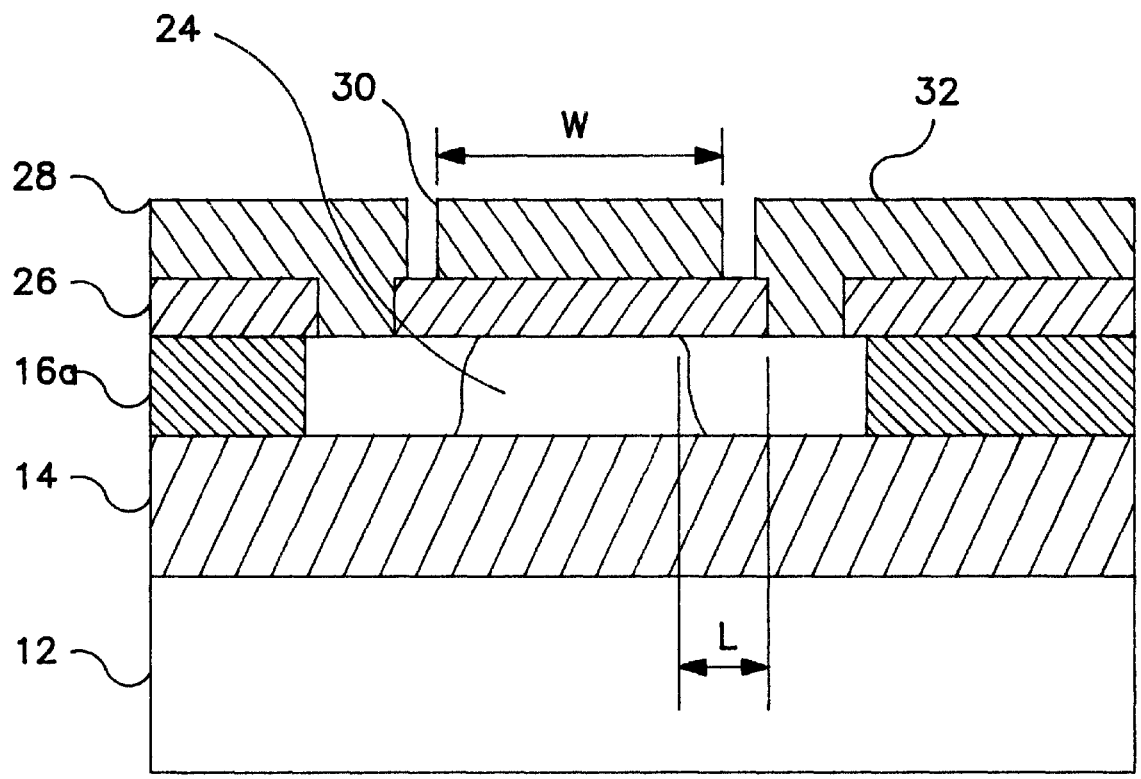
FIG. 2f is a cross-sectional view of the structure of a SOI MOSFET showing the relationship between the body, thick oxide, and gate regions.

Thus, a process for forming a thick oxide SOI MOSFET has been described in which the gate consists of a metal film and the insulator is the BEOL Inter-Level Dielectric (ILD). The inventors have also discovered that by varying the gate width "W", shown in FIG. 2f, the failure mechanism melting silicon and shorting the source, drain, and body regions may be modified. The wider W can be made, the smaller the possibility of the failure occurring. Furthermore, by overlapping the insulating layer 26, which is formed above the body region 24 by a predetermined length "L", as shown, ESD protection can be improved.

A polysilicon layer may be deposited over the SOI structure, masked, and etched to define the gate region before the deposition of the thick oxide insulator. After deposition of the thick oxide insulator, the metallization process may be performed to define the contacts to the various regions.

Figure 3A:
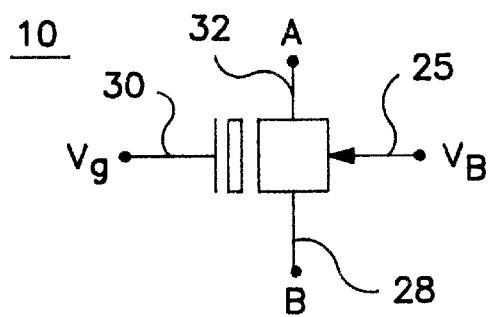
FIGS. 3a and 3b are circuit schematics of the SOI NMOSFET of FIG. 2d.
Figure 3B:
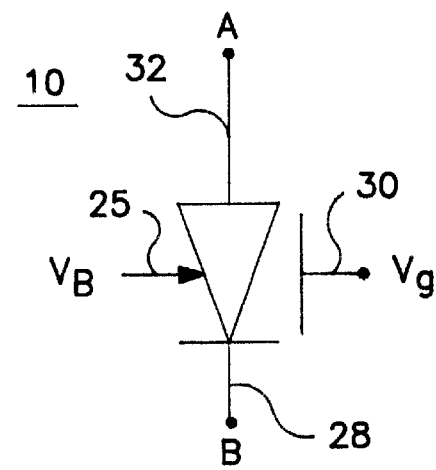

The thick oxide NMOSFET, of FIG. 2d is shown as a circuit schematic in FIG. 3a. As illustrated, thick oxide NMOSFET 10 comprises source lead 28, drain lead 32, body lead 25, and gate lead 30. Source lead 28 is connected to terminal B; drain lead 32 is connected to terminal A; body lead 25 is connected to $V_B$; and gate lead 30 is connected to $V_g$. NMOSFET 10 may be represented by the diode symbol, as shown in FIG. 3b.

Figure 4A:
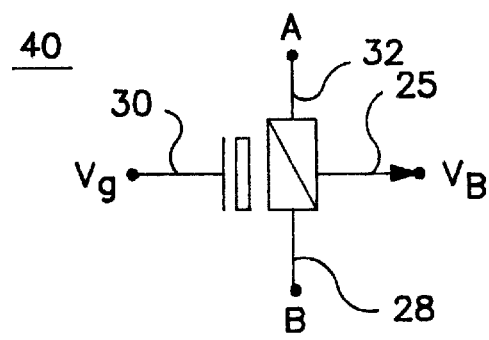
FIGS. 4a and 4b are circuit schematics of the SOI PMOSFET of FIG. 2e.

Similarly, the thick oxide PMOSFET of FIG. 2e is shown as a circuit schematic in FIG. 4a. As illustrated, thick oxide PMOSFET 40 comprises source lead 28, drain lead 32, body lead 25, and gate lead 30. PMOSFET 40 may be represented by the diode symbol, as shown in FIG. 4b.

The operation of NMOSFET 10 will now be explained as it turns on and provides ESD protection. A first turn-on condition occurs when the body of NMOSFET 10 is subjected to a voltage which exceeds the voltage at the source of NMOSFET 10. When this condition occurs, a forward-biased diode attribute allows a current flow from the body terminal to the source terminal. A second turn-on condition occurs when the voltage at the gate of NMOSFET 10 exceeds the threshold voltage of NMOSFET 10. When this condition occurs, a turned-on transistor attribute allows current flow from the drain terminal to the source terminal.

Figure 4B:
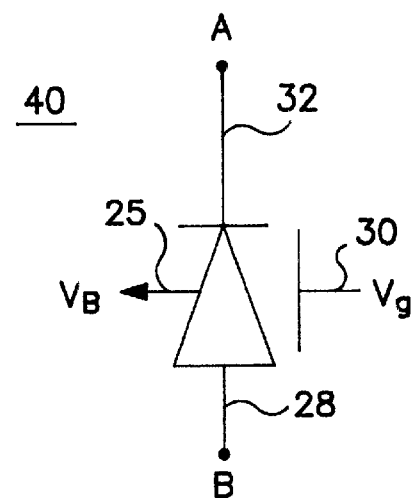

In a similar manner, for the PMOSFET 40, shown in FIGS. 4a and 4b, when a negative pulse is applied to terminal A which is lower than the body voltage by an amount equal to a diode forward-biased voltage, a forward-biased diode attribute allows current flow from the body terminal to the drain terminal of PMOSFET 40. A second turn-on condition occurs when the voltage at the gate terminal of PMOSFET 40 is lower then the threshold voltage of PMSOFET 40. When this condition occurs, a turned-on transistor attribute allows current to flow from the source terminal to the drain terminal.

Figure 5A:
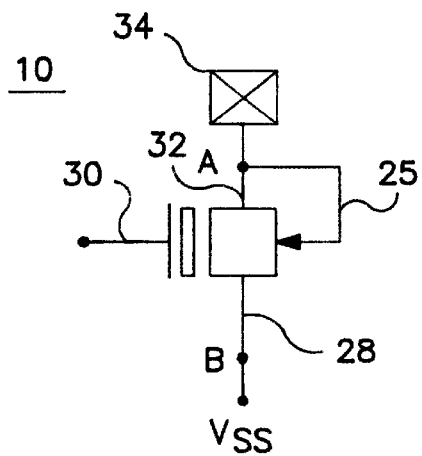
FIGS. 5a–5c are circuit schematics of the SOI NMOSFET of FIG. 2d showing various coupling arrangements in accordance with a preferred embodiment of the present invention.
Figure 5B:
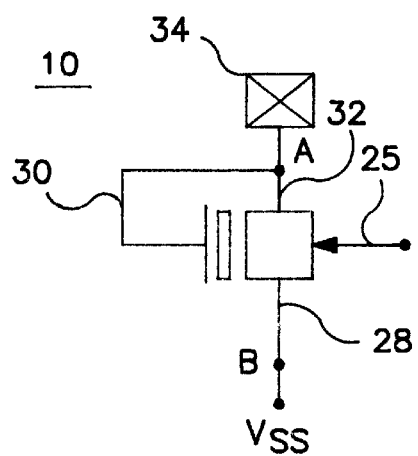
Figure 5C:
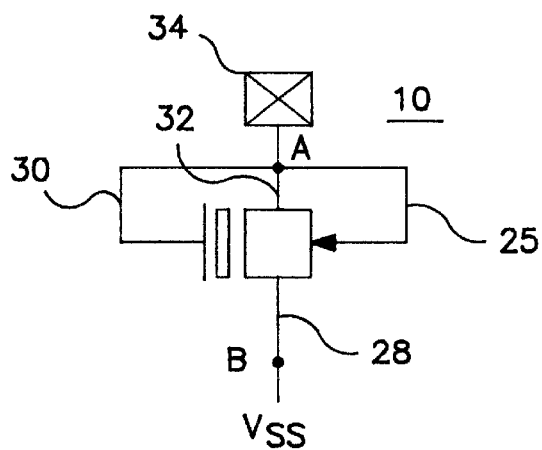

FIGS. 5a–5c illustrate using the thick oxide NMOSFET 10 as described above in a variety of ESD applications in accordance with an embodiment of the present invention. As shown in FIG. 5a, NMOSFET 10 has its body lead 25 connected to its drain lead 32 at terminal A. Terminal A is connected to pad 34 and source lead 28 is connected to $V_{SS}$ (usually at ground potential) at terminal B; the gate lead 30 is not connected. In this ESD application, thick oxide NMOSFET 10 is body-coupled to the drain terminal and provides ESD protection when the voltage at pad 34 increases above the diode forward-biased voltage existing between the body and the source terminals.

FIG. 5b illustrates the thick oxide NMOSFET 10 in a gate-coupled arrangement. As shown, NMOSFET 10 has its gate lead 30 connected to its drain lead 32 at terminal A. Terminal A is connected to pad 34 and source lead 28 is connected to $V_{SS}$ at terminal B; body lead 25 is not connected. In this ESD application, thick oxide NMOSFET 10 is gate-coupled to the drain terminal and provides ESD protection when the voltage at pad 34 increases above the threshold voltage of NMOSFET 10. When the voltage at pad 34 exceeds the threshold voltage, current flows from the pad to the $V_{SS}$ supply.

FIG. 5c illustrates the thick oxide NMOSFET 10 in a body-and gate-coupled arrangement. As shown, NMOSFET 10 has its gate lead 30 and body lead 25 connected to terminal A. Terminal A is connected to pad 34 and source lead 28 is connected to $V_{SS}$ at terminal B. In this ESD application, thick oxide NMOSFET 10 provides ESD protection at a first turn-on condition and a second turn-on condition, as described previously.

Thus, NMOSFET 10 in a body-and gate-coupled arrangement operates as follows. When a positive voltage is applied to pad 34, current is discharged through the p-n diode formed by the body and source. In parallel, as the body voltage increases, the threshold voltage of NMOSFET 10 decreases, creating a dynamic threshold. As the threshold voltage decreases, the gate-coupling of the NMOSFET turns on the NMOSFET in parallel with the diode. This is a unique aspect of the body-and-gate-coupled device as it has parallel operations of a diode attribute and a transistor attribute. NMOSFET, 10 uses body-coupling to lower the absolute value of the threshold voltage and gate-coupling to turn on the transistor element prior to snapback.

The body-and-gate coupling of NMOSFET 10 may be conceptually treated as a bipolar transistor with large current gain. The drain current may be modeled as the collector current, the body (gate) current as the base current, and the source current may be the emitter current. Even though, for ease of analysis, this device may be treated as a bipolar device, it is indeed a NMOSFET because the current conduction is through the surface channel and is controlled by the gate. The "apparent" gain of the "bipolar" device is large, because the threshold voltage of the NMOSFET is being modulated by the applied bias to the silicon film. This gives the appearance of large bipolar gain at low biases.

The threshold voltage of the NMOSFET may be controlled with the dimensions of the channel. A smaller length channel has a smaller threshold voltage. By changing the threshold-adjust implants (conventional implants that are used to control the threshold voltage), the threshold voltage may easily be changed.

Figure 6:
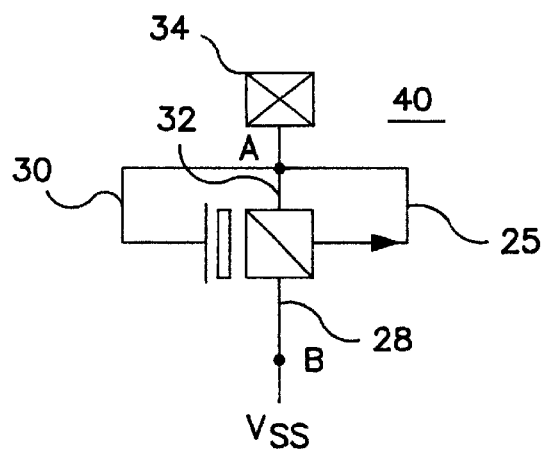
FIG. 6 is a circuit schematic of the SOI PMOSFET of FIG. 2e showing a body-coupled and gate-coupled arrangement in accordance with a preferred embodiment of the present invention.

Although the description above refers to a thick oxide NMOSFET device, a similar description is applicable to a PMOSFET device. Thus, the PMOSFET device may be arranged in a body-coupled configuration, a gate-coupled configuration, or a body-and-gate-coupled configuration. FIG. 6 illustrates PMOSFET 40 configured as a body-and-gate-coupled device. As shown, body lead 25, gate lead 30, and drain lead 32 are connected at terminal A. Source lead 28 is connected to $V_{SS}$ at terminal B and terminal A is connected to pad 34.

When a negative-going pulse is applied to pad 34, the current is discharged through the n-p diode formed by the body and the drain of the PMOSFET structure. In parallel, as the body voltage decreases, the magnitude of the threshold voltage of PMOSFET 40 decreases, again creating a dynamic threshold. As the threshold voltage decreases, the gate-coupling of the PMOSFET turns on the transistor in parallel with the diode. That is, PMOSFET 40 uses body coupling to lower the absolute value of the threshold voltage and gate coupling to turn on the transistor prior to PFET snapback.

Figure 7:
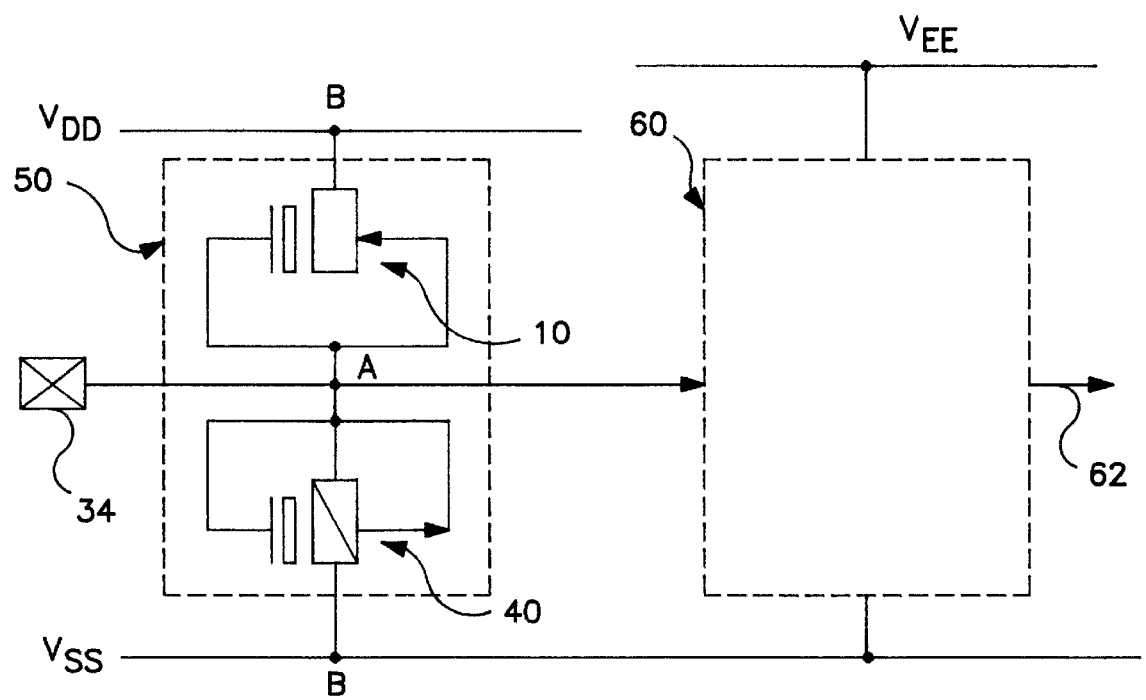
FIG. 7 is an exemplary circuit schematic of an ESD protection device using the NMOSFET of FIG. 5c and the PMOSFET of FIG. 6.

FIG. 7 illustrates NMOSFET 10 and PMOSFET 40 operating together in a first stage ESD protection device 50. NMOSFET 10 is coupled to $V_{DD}$ at terminal B and to pad 34 at terminal A. PMOSFET 40 is coupled to $V_{SS}$ at terminal B and to pad 34 at terminal A. $V_{DD}$ is a predetermined high voltage supply, for example 3.4 V, and $V_{SS}$ is a predetermined low voltage supply, for example ground voltage. When an input signal is applied at pad 34, NMOSFET 10 changes the input signal to $V_{DD}$ (plus a threshold voltage) by sinking more current to terminal B. PMOSFET 40 clamps the input signal to $V_{SS}$ (minus a threshold voltage) when the input signal falls below $V_{SS}$. When the input signal falls below $V_{SS}$ by the threshold voltage amount, PMOSFET 40 drives more current to the device from the $V_{SS}$ supply. In this manner, ESD protection is provided for input signals rising above and below the predetermined high voltage supply and low voltage supply, respectively.

As shown in FIG. 7, other stages, for example second stage ESD protection device 60, may be added onto first stage ESD protection device 50 when mixed voltage interfacing is involved. The first stage is connected between the signal pad and the subsequent stage and protects against ESD events having voltages above $V_{DD}$ and below $V_{SS}$. Second stage 60 is connected between first stage 50 and perhaps yet another stage (not shown) and protects against an ESD event having voltages above $V_{EE}$ (for example 4.1 volts) and below $V_{SS}$. Thus, signal output 62 is clamped between 4.1 volts (for example) and the ground voltage of zero volts (for example).

Although specific examples and elements are shown in reference to the drawing, it will be understood that other appropriate combinations of elements may be used. For example, first stage ESD protection device 50, shown in FIG. 7, may be comprised of two NMOSFETs, two PMOSFETs, or one NMOSFET and one PMOSFET. In addition, several stages of various element combinations may be used. Assaderaghi et al. disclose various combinations of ESD protection networks in the '857 patent; those combinations are incorporated herein by reference.

Figure 8:
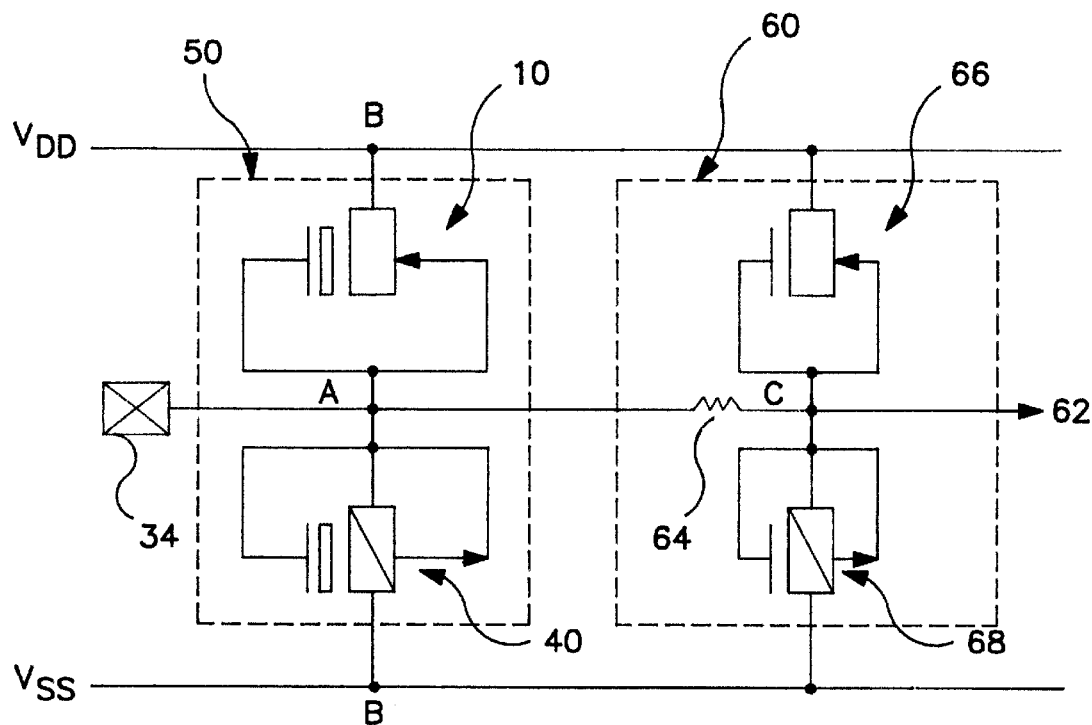
FIGS. 8 and 9 are exemplary circuits of an ESD protection device showing different combinations of a thick oxide device with a thin oxide device.

FIG. 8 shows another combination of elements. As shown, first stage protection device 50 is comprised of a thick oxide NMOSFET 10 and a thick oxide PMOSFET 40. The second stage protection device 60 is comprised of a thin oxide NMOSFET 66 and a thin oxide PMOSFET 68. The second stage is coupled to the first stage by a series resistor 64.

Figure 9:
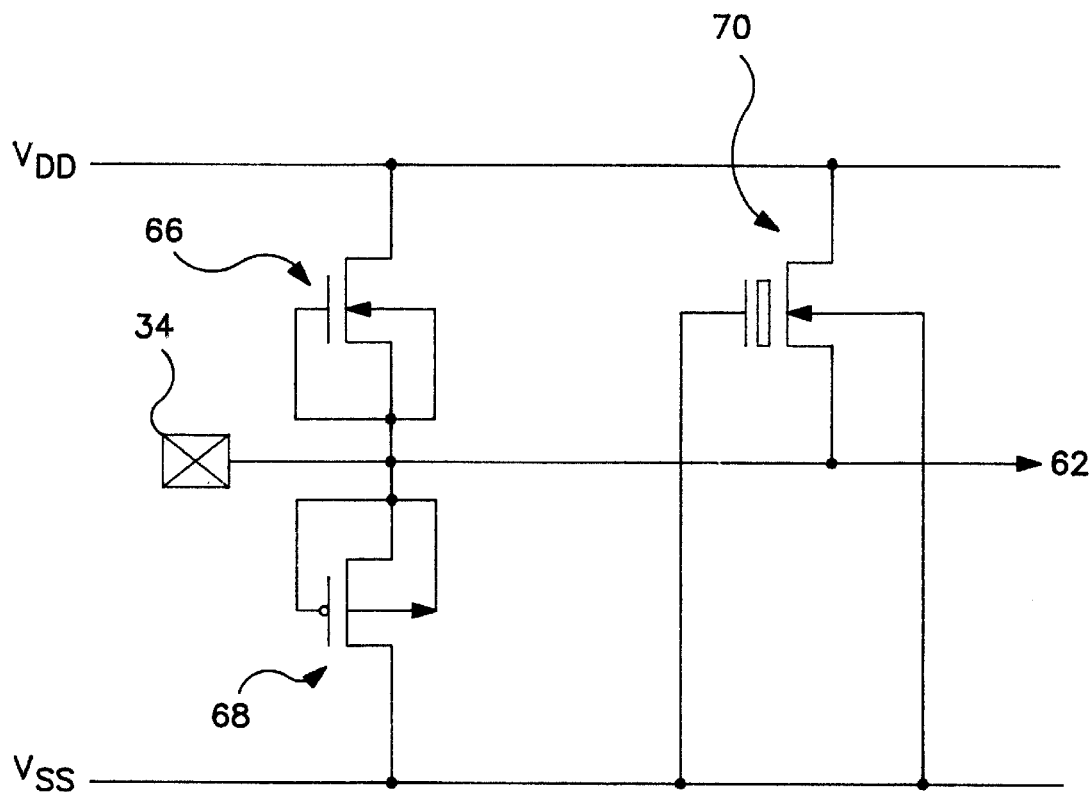

FIG. 9 shows another embodiment having a thick oxide transistor 70 providing ESD protection. The thick oxide transistor 70 is connected to a first stage, the first stage including a thin oxide NMOSFET 66 and a thin oxide PMOSFET 68. It will be appreciated that the body and gate of thick oxide transistor 70 are connected to $V_{SS}$ (or a ground reference potential and are not connected to either the source or the drain of transistor 70. Thus, in this embodiment the transistor is not body and gate coupled.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for forming a thick oxide field effect transistor comprising the steps of:
    a) providing a silicon-on-insulator structure having a semiconductor island formed by shallow trench isolation, wherein the semiconductor island is of a first conductivity type;
    b) forming a source and a drain in the semiconductor island with a dopant having a second conductivity type, wherein a remaining region of the first conductivity type is a body;
    c) forming a contiguous insulating layer above the source, drain, and body;
    d) etching the contiguous insulating layer to form a thick oxide gate above the body; and
    e) forming metal leads to contact the source, drain, body, and gate.

2. The process of claim 1 wherein step d) includes overlapping the insulating layer beyond the gate for improving electrostatic discharge protection.

3. The process of claim 2 wherein step e) includes widening the metal lead contacting the gate for improving electrostatic discharge protection.

4. The process of claim 3 wherein the insulating layer is formed from silicon dioxide having a thickness ranging between 2,000 and 3,000 Angstroms.

5. The process of claim 1 wherein step e) includes connecting the gate, body, and drain to a first terminal and connecting the source to a second terminal.

6. The process of claim 5 wherein step e) includes forming a pad electrically connected to one of the first terminal and the second terminal.

7. The process of claim 6 wherein step e) includes forming a voltage reference terminal electrically connected to the other one of the first terminal and the second terminal.

8. The process of claim 1 wherein step b) includes ion implanting of n+ impurities as a dopant for the second conductivity type.

9. The process of claim 1 wherein step b) includes ion implanting of p+ impurities as a dopant for the second conductivity type.

10. The process of claim 1 wherein
    step (d) includes etching the contiguous insulating layer to expose the source and drain; and
    step (e) includes forming metal leads to contact the source and drain exposed in step (d).

* * * * *